(12) United States Patent
McRay (10) Patent No.: US 9,368,326 B2
(45) Date of Patent: *Jun. 14, 2016

(54) SCAN HEAD AND SCAN ARM USING THE SAME

(71) Applicant: ADVANCED ION BEAM TECHNOLOGY, INC., Fremont, CA (US)

(72) Inventor: Richard F. McRay, Penn Valley, CA (US)

(73) Assignee: ADVANCED ION BEAM TECHNOLOGY, INC., Hsinchu (TW)

( * ) Notice: Subject to any disclaimer, the term of this patent is extended or adjusted under 35 U.S.C. 154(b) by 304 days.

This patent is subject to a terminal disclaimer.

(21) Appl. No.: 13/919,651

(22) Filed: Jun. 17, 2013

(65) Prior Publication Data

US 2014/0367587 A1    Dec. 18, 2014

(51) Int. Cl.
*G01N 23/00* (2006.01)
*H01J 37/317* (2006.01)
*H01J 37/20* (2006.01)

(52) U.S. Cl.
CPC ............. *H01J 37/3171* (2013.01); *H01J 37/20* (2013.01); *H01J 2237/20207* (2013.01); *H01J 2237/20228* (2013.01); *H01J 2237/20285* (2013.01)

(58) Field of Classification Search
None
See application file for complete search history.

(56) References Cited

U.S. PATENT DOCUMENTS

| 7,030,395 | B2 * | 4/2006 | Deak, IV | H01L 21/67069 250/442.11 |
| 7,057,192 | B2 * | 6/2006 | Kaim | H01J 37/3171 250/442.11 |
| 8,895,944 | B2 * | 11/2014 | McRay | H01L 21/6831 250/442.11 |
| 2003/0197133 | A1 * | 10/2003 | Turner | H01J 37/20 250/492.21 |
| 2005/0173656 | A1 * | 8/2005 | Kaim | H01J 37/3171 250/492.21 |
| 2005/0191409 | A1 * | 9/2005 | Murrell | H01J 37/3171 427/8 |
| 2006/0027763 | A1 * | 2/2006 | Deak, IV | H01L 21/67069 250/492.21 |
| 2011/0042578 | A1 * | 2/2011 | Murrell | H01J 37/304 250/397 |
| 2013/0187349 | A1 * | 7/2013 | McRay | H01L 21/6831 279/128 |

FOREIGN PATENT DOCUMENTS

| JP | 117915 A | 1/1999 |
| JP | 2006236811 A | 9/2006 |

OTHER PUBLICATIONS

U.S. Appl. No. 13/745,426, filed Jan. 18, 2013.

* cited by examiner

*Primary Examiner* — Andrew Smyth
(74) *Attorney, Agent, or Firm* — Muncy, Geissler, Olds & Lowe, P.C.

(57) ABSTRACT

A scan head assembled to a scan arm for an ion implanter and a scan arm using the same are provided, wherein the scan head comprises a case, a shaft assembly, an ESC, a first driving mechanism and a second driving mechanism. The case has a normal center line. The shaft assembly passes through a first side of the case and has a twist axis, a first pivot point fixed relative to the case and a first end located outside the case. The ESC is fastened on the first end and capable of holding a work piece. The first driving mechanism is capable of driving the shaft assembly, the ESC and the work piece to tilt relative to the normal center line. The second driving mechanism is capable of driving the shaft assembly, the ESC and the work piece to rotate about the twist axis.

9 Claims, 10 Drawing Sheets

SCAN HEAD AND SCAN ARM USING THE SAME

FIELD OF THE INVENTION

The present invention generally relates to a scan arm, and more particularly to a scan arm for an ion implanter.

DESCRIPTION OF THE RELATED ART

Scan arm, an important driving device of an ion implanter, is mainly used to bring a work piece, such as a wafer, held on an electrostatic chuck (ESC) of the scan arm to move during an ion implantation process, so as to enable the work piece to be scanned by a charged particle beam, such as an ion beam, provided by the ion implanter. A conventional scan arm is usually composed of a horizontal arm fixed within a chamber of the ion implanter, a swing arm, a swing driver for driving the swing arm to swing about the horizontal arm, a scan head with the ESC and a twist driver for driving the ESC and the work piece to rotate about a twist axis of the ESC. As a result, in order to completely scan whole or part of the work piece by the charged particle beam, the work piece can be moved not only horizontally relative to the charged particle beam when the swing arm is swung by the swing driver, but also vertically relative to the charged particle beam when the ESC is rotated by the twist driver.

It should be noted that, in some specific cases, it is necessary to transmit the charged particle beam toward the work piece along a direction not parallel to a center line of the work piece. In such cases, an orientation of the work piece will be continuously varied during the swing arm swings the work piece relative to the charged particle beam. In detail, during the swing arm swings the work piece with a 10 degrees horizontal angle and a 0 degree vertical angle formed between a transmission path of the charged particle beam and the center line of the work piece from a highest position to a lower position without adjusting the orientation of the work piece, the horizontal angle will be continuously decreased and the vertical angle will be continuously increased, so that a projection contour of the charged particle beam projected on the work piece is continuously varied. Therefore, an undesired non-uniform implantation process will be implemented since doses of impurities, for example ions, doped into the work piece will be continuously varied. As a result, it is desired to provide a novel structure and control manner to the scan arm.

SUMMARY OF THE INVENTION

The present invention is directed to a scan head capable of essentially maintaining an orientation of a work piece relative to a charged particle beam during an ion implantation.

The present invention is further directed to a scan arm with a scan head capable of essentially maintaining an orientation of a work piece relative to a charged particle beam during an ion implantation.

The present invention provides a scan head assembled to a scan arm for an ion implanter, wherein the scan head comprises a case, a shaft assembly, an ESC, a first driving mechanism and a second driving mechanism. The case has a normal center line. The shaft assembly passes through a first side of the case and has a twist axis, a first pivot point fixed relative to the case, a first end located outside the case and a second end located inside the case. The ESC is fastened on the first end and capable of holding a work piece. The first driving mechanism is capable of driving the shaft assembly, the ESC and the work piece to tilt relative to the normal center line. The second driving mechanism is capable of driving the shaft assembly, the ESC and the work piece to rotate about the twist axis.

According to an embodiment of the present invention, the first driving mechanism comprises a relay lever set and a motor. The relay lever set has a third end linking up with a position of the shaft assembly away from the first pivot point and a fourth end opposite to the third end. The motor links up with the fourth end and is capable of driving the relay lever set to move along a direction parallel to the tilt axis.

According to an embodiment of the present invention, the first driving mechanism comprises a frame set, a pair of lead screws, a pair of motors, a pair of first gear racks, a center gear, a second gear rack and a relay lever set. The frame set is fixed relative to the case. The lead screws pass through the frame set and axes of the lead screws are parallel to a first direction. The motors are fixed relative to the frame set and capable of driving the lead screws to rotate about the first direction respectively. Each of the first gear racks has a threaded hole engaging with one of the lead screws and a plurality of first teeth arranged along the first direction. The center gear engages between the first teeth of the two gear racks. The second gear rack has a shifting hole and a plurality of second teeth, wherein the second teeth engage with the center gear and are arranged along a second direction not parallel to the first direction. The relay lever set has a second pivot point fixed relative to the case, a third end fitting around the second end and a fourth end inserted in the shifting hole. In a preferred embodiment, the second gear rack can further have a first guide portion parallel to the second direction, and the frame set comprises a fixed frame and a slide frame. Here, the fixed frame can be fixed in the case, be passed through by the lead screws and have two second guide portions parallel to the first direction, and the motors can be fastened on the fixed frame, while the slide frame can comprise two third guide portions, a gear receiver, two windows, a cover, a gear shaft and a fourth guide portion. In such an embodiment, the slide frame can be glidingly assembled with the fixed frame via combinations of the second guide portions and the third guide portions, and each one of the first gear racks can be glidingly assembled between one of the second guide portions and one of the third guide portions. In addition, the center gear can be received in the gear receiver, the windows can be respectively formed between one of the third guide portions and the gear receiver, and the cover can cover the gear receiver. Besides, the gear shaft can pass through the center gear and can be held between the gear receiver and the cover, and the second gear rack can be glidingly assembled with the slide frame via combinations of the first guide portion and the fourth guide portion. In a specific preferred embodiment, the first direction can be perpendicular to the second direction. In other preferred embodiment, the relay lever set can comprise a first pivot shaft fixed relative to the case for providing the second pivot point, a first relay lever having the fourth end, a fifth end pivoted to the first pivot shaft and a sixth end, and a second relay lever having the third end and a seventh end pivoted to the sixth end.

According to an embodiment of the present invention, the second driving mechanism comprises a gimbal assembly fitting around the shaft assembly for providing the first pivot point, a motor having a shaft parallel to the normal center line, and a pinion gear fitting onto the shaft and engaging with the gimbal assembly. In a specific preferred embodiment, the gimbal assembly can be located between the ESC and the first driving mechanism. In a preferred embodiment, the gimbal assembly can comprise an inner ring, a middle ring and an outer ring, wherein the inner ring can fit around the shaft assembly, and the middle ring can be pivoted around the inner ring by a pair of first pivot shafts. Besides, the outer ring can be fit within the case via a bearing, be pivoted around the middle ring by a pair of second pivot shafts perpendicular to the first pivot shafts, and have a plurality of teeth formed around an outer surface of the outer ring and engaging with the pinion gear.

The present invention also provides a scan arm for an ion implanter, wherein the scan arm comprises a scan head, a first driving mechanism, a second driving mechanism, a swing arm, a horizontal arm, a third driving mechanism and a fourth driving mechanism. The scan head has a normal center line and a twist axis adjustable relative to the normal center line, and is capable of holding a work piece, and the first driving mechanism is capable of driving the work piece to tilt relative to the normal center line, while the second driving mechanism is capable of driving the work piece to rotate about the twist axis. The swing arm has a tilt axis, a first end and a second end opposite to the first end, while the horizontal arm has a horizontal axis, wherein the scan head is disposed at the first end, while the horizontal arm is disposed at the second end. The third driving mechanism is capable of driving the swing arm to rotate about the tilt axis, while the fourth driving mechanism is capable of driving the swing arm to swing about the horizontal axis. In addition, at least one of the first driving mechanism, the second driving mechanism and the third driving mechanism is activated during the fourth driving mechanism drives the swing arm and the scan head to swing, so as to essentially maintain an orientation of the work piece.

According to an embodiment of the present invention, the scan head has a shaft assembly with the twist axis and a first pivot point fixed in the scan head, while the first driving mechanism is disposed between the swing arm and the scan head and comprises at least a motor and a relay lever set. The motor has a shaft parallel to the tilt axis, while the relay lever set has a second pivot point fixed in the scan head, a first end linking up with the shaft and a second end linking up with a position of the shaft assembly away from the first pivot point.

According to an embodiment of the present invention, the scan head has a shaft assembly with the twist axis and a pivot point fixed in the scan head, while the second driving mechanism is disposed in the scan head and comprises a gimbal assembly, at least a motor and a pinion gear. The gimbal assembly fits around the shaft assembly for providing the first pivot point, the motor has a shaft parallel to the normal center line, and the pinion gear fits onto the shaft and engages with the gimbal assembly. In a preferred embodiment, the gimbal assembly can comprise an inner ring, a middle ring and an outer ring, wherein the inner ring can fit around the shaft assembly, and the middle ring can be pivoted around the inner ring by a pair of first pivot shafts. Also, the outer ring can be fit within a case of the scan head via a bearing, be pivoted around the middle ring by a pair of second pivot shafts perpendicular to the first pivot shafts, and have a plurality of teeth formed around an outer surface of the outer ring and engaging with the pinion gear.

According to an embodiment of the present invention, the tilt axis is aligned a center of the work piece.

According to an embodiment of the present invention, the third driving mechanism is disposed between the swing arm and the horizontal arm and comprises at least a motor, a pinion gear and a ring gear. The motor has a shaft parallel to the tilt axis, the pinion gear fits onto the shaft, and the ring gear fits onto the swing arm and engages with the pinion gear.

According to an embodiment of the present invention, the fourth driving mechanism is disposed in the horizontal arm, and an axis of a shaft of the fourth driving mechanism is coincident with the horizontal axis.

Accordingly, the scan head and the arm as illustrated in the present application can essentially maintaining the orientation of the work piece relative to the charged particle beam during an ion implantation.

DETAILED DESCRIPTION OF THE INVENTION

Reference will now be made in detail to specific embodiments of the present invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a thorough understanding of the present invention.

The present invention may be practiced without some or all of these specific details. In other instances, well-known process operations are not described in detail in order not to obscure the present invention. Besides, in all of the following embodiments, the same or similar components illustrated in different embodiments refer to the same symbols.

Figure 1:
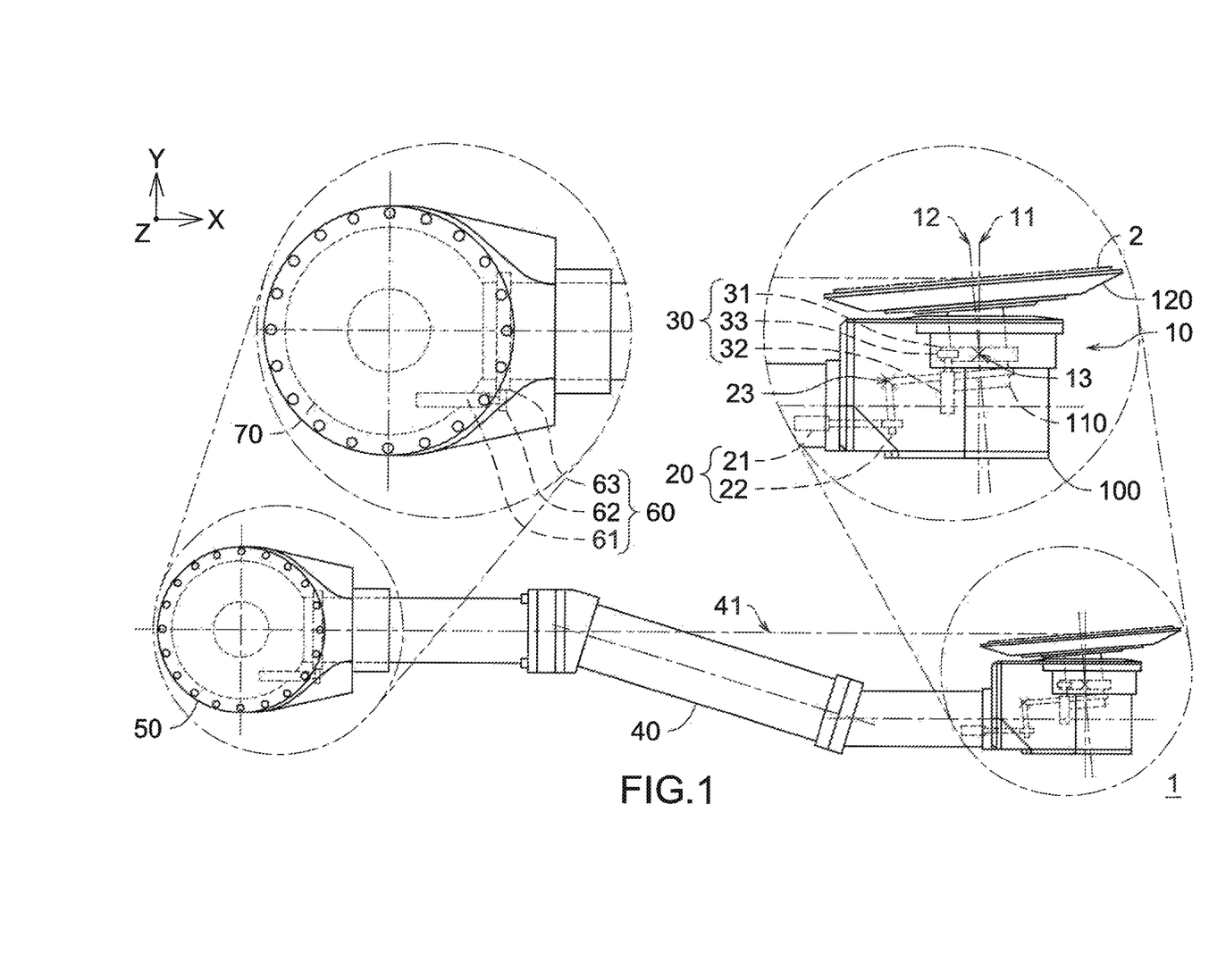
FIG. 1 illustrates a front view of a scan arm carrying a work piece at a first position according to an embodiment of the present invention, wherein a twist axis of a scan head is tilted counterclockwise relative to a normal center line of the scan head.
Figure 2:
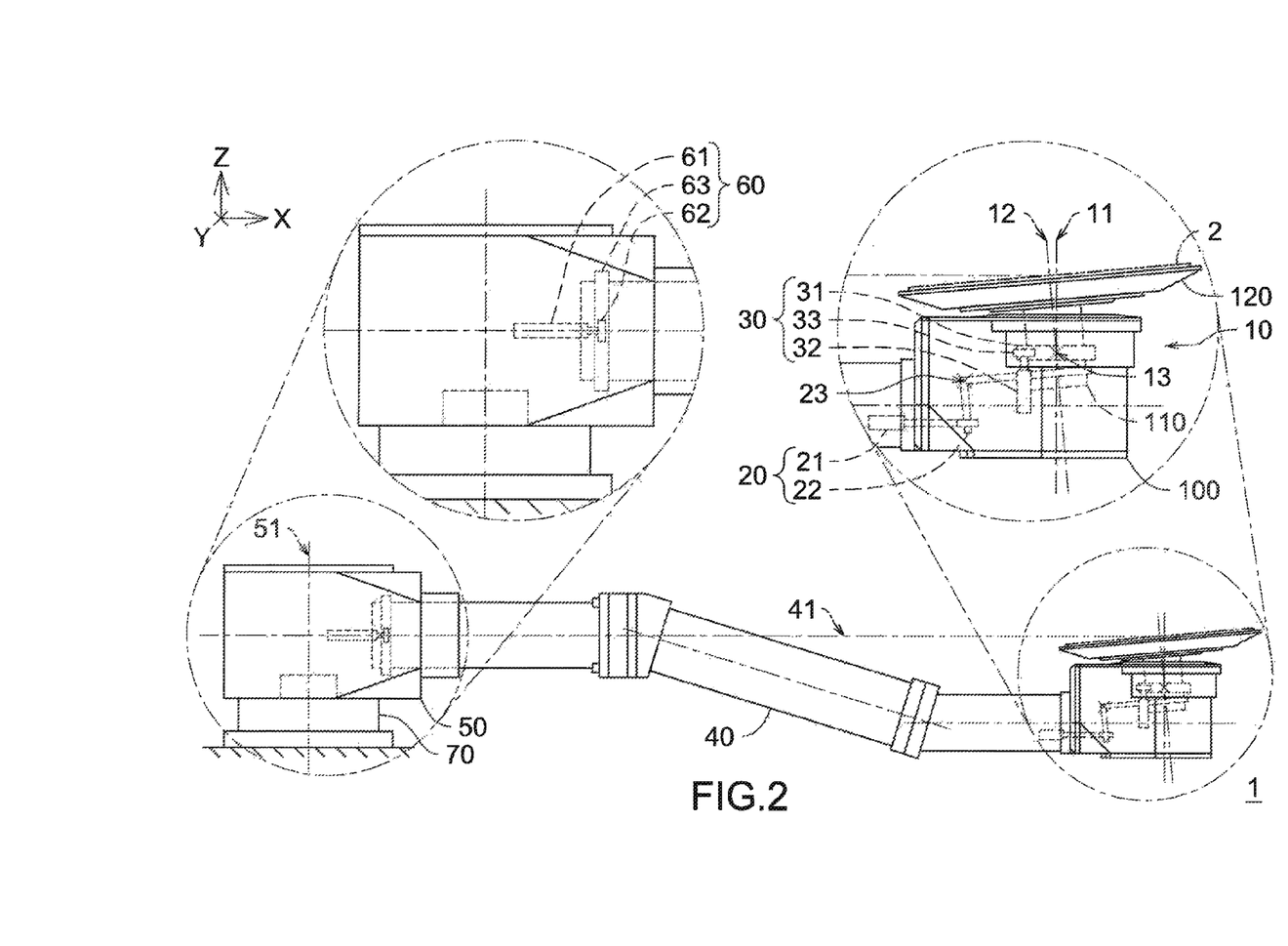
FIG. 2 illustrates a bottom view of the scan arm carrying the work piece at a second position according to the embodiment illustrated in FIG. 1, wherein a swing arm is rotated 90 degrees about its tilt axis, so that the normal center line is parallel to a horizontal axis of a horizontal arm.
Figure 3:
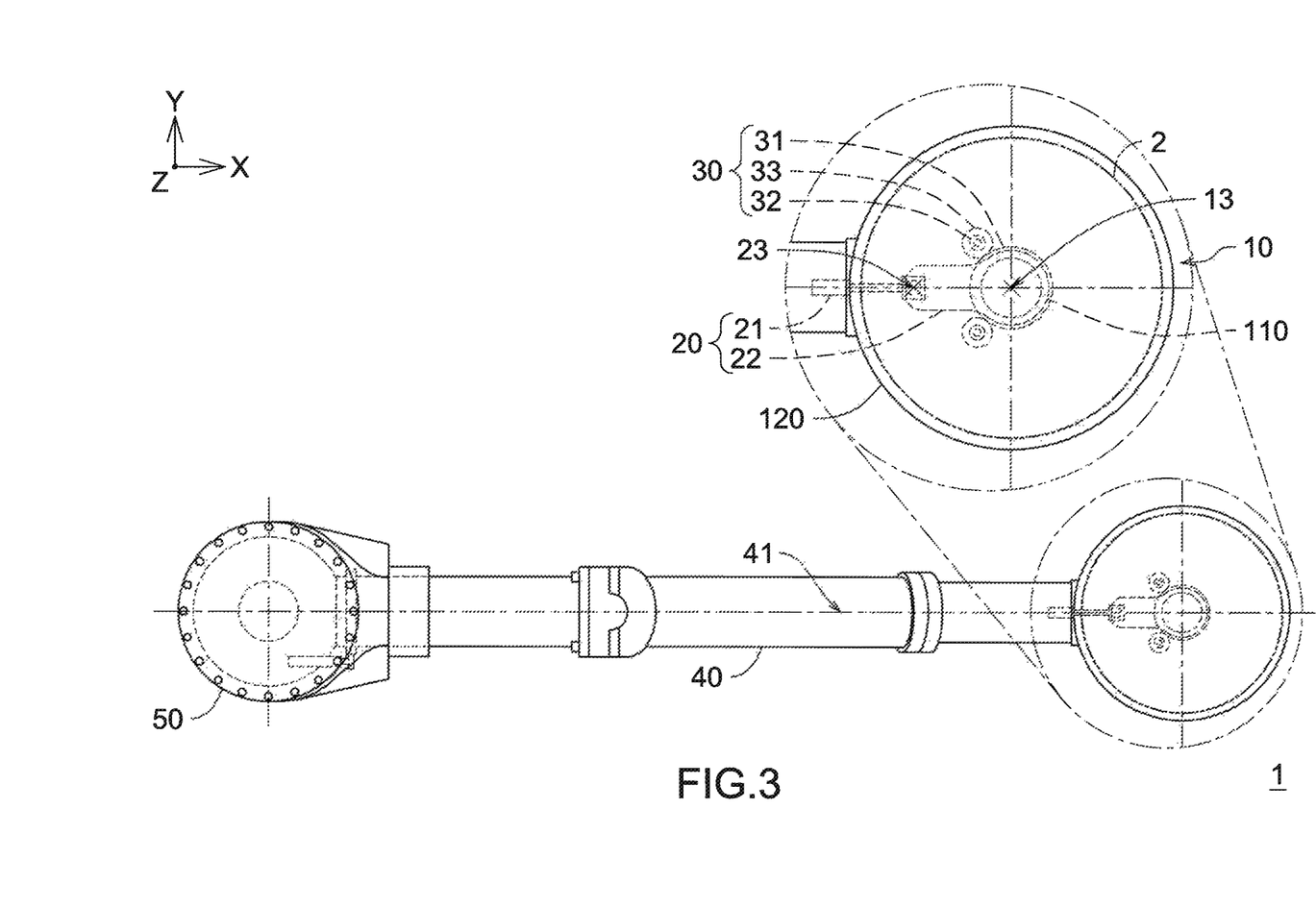
FIG. 3 illustrates another front view of the scan arm carrying the work piece at a third position according to the embodiment illustrated in FIG. 2, wherein the twist axis coincides with the normal center line and is parallel to the horizontal axis.
Figure 4:
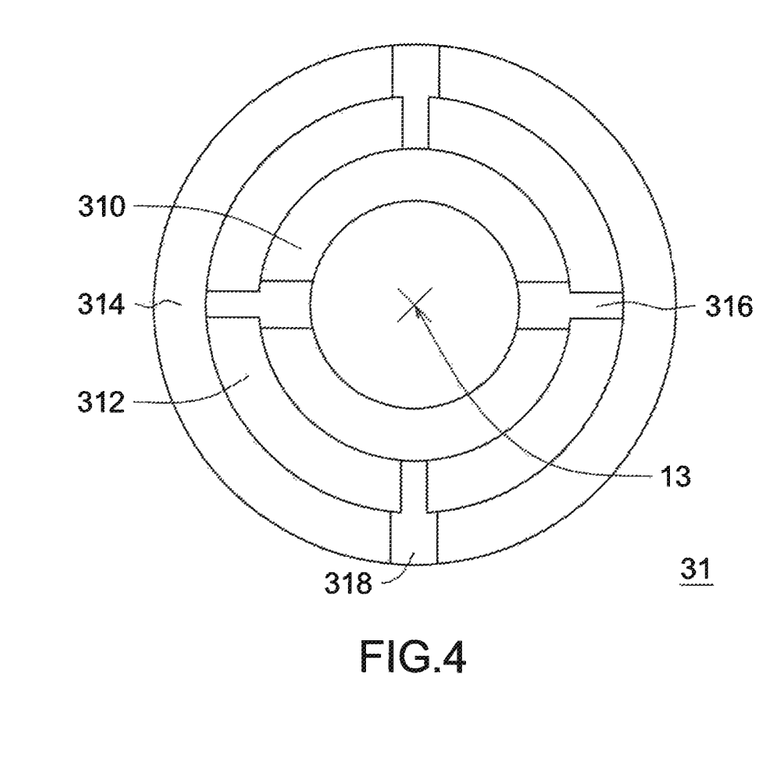
FIG. 4 illustrates a schematic structural view of a gimbal assembly according to an embodiment of the present invention.
Figure 10:
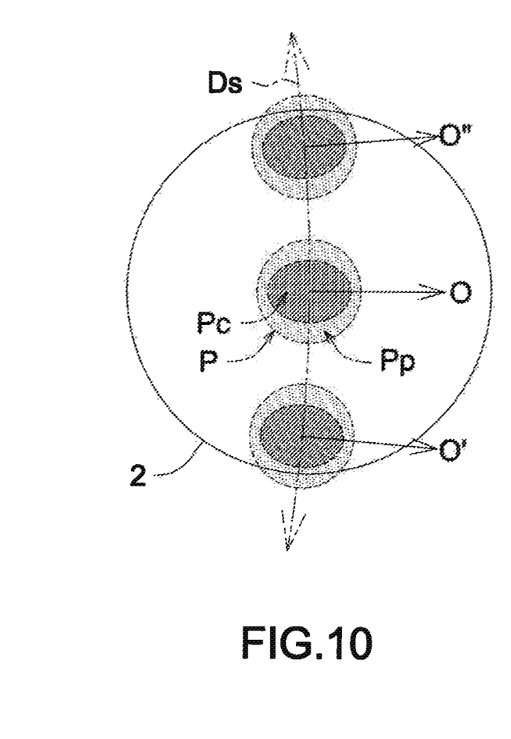
FIG. 10 illustrates several projection contours of a charged particle beam projected on different locations of the work piece as illustrated in FIG. 3 during the work piece is swung.
Figure 11:
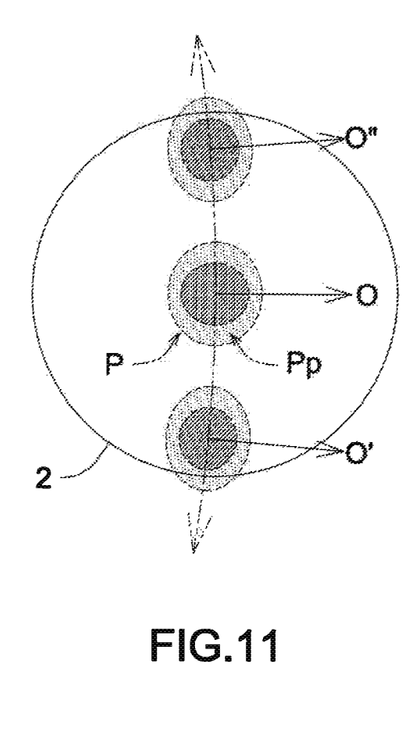
FIG. 11 illustrates several projection contours of a charged particle beam projected on different locations of the work piece as illustrated in FIG. 2 during the work piece is swung, wherein the orientation of the work piece is not adjusting.
Figure 12:
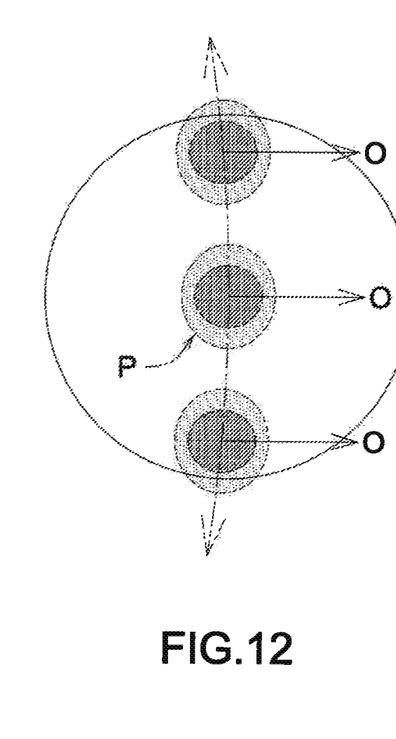
FIG. 12 illustrates several projection contours of a charged particle beam projected on different locations of the work piece as illustrated in FIG. 2 during the work piece is swung, wherein the orientation of the work piece is continuously adjusted as desired.

FIG. 1 illustrates a front view of scan arm carrying a work piece at a first position according to an embodiment of the present invention, wherein a twist axis of a scan head is tilted counterclockwise relative to a normal center line of the scan head. In addition, FIG. 2 illustrates a bottom view of the scan arm carrying the work piece at a second position according to the embodiment illustrated in FIG. 1, wherein a swing arm is rotated 90 degrees about its tilt axis, so that the normal center line is parallel to a horizontal axis of a horizontal arm. Besides, FIG. 3 illustrates another front view of the scan arm carrying the work piece at a third position according to the embodiment illustrated in FIG. 2, wherein the twist axis coincides with the normal center line and is parallel to the horizontal axis. Moreover, FIG. 4 illustrates a schematic structural view of a gimbal assembly according to an embodiment of the present invention. Further, FIG. 10 illustrates several projection contours of a charged particle beam projected on different locations of the work piece, wherein as illustrated in FIG. 3 during the work piece is swung. In contrast, each one of FIGS. 11 to 12 illustrates several projection contours of a charged particle beam projected on different locations of the work piece as illustrated in FIG. 2 during the work piece is swung, wherein the orientation of the work piece as shown in FIG. 11 is not adjusting, and that as shown in FIG. 12 is continuously adjusted as desired. Besides, all of the upper side (upward), the lower side (downward), the left side (leftward) and the right side (rightward) described in the present embodiment refer to the orientation of FIG. 1 and FIG. 3.

Referring to FIG. 1 to FIG. 3 together, a scan arm 1 for an ion implanter is capable of bringing a work piece 2, for example a wafer, to move relative to a charged particle beam (not shown), for example an ion beam, during an ion implantation process and comprises a scan head 10, a first driving mechanism 20, a second driving mechanism 30, a swing arm 40, a horizontal arm 50, a third driving mechanism 60 and a fourth driving mechanism 70. In the present embodiment, the scan head 10 is capable of holding the work piece 2, for example with an ESC 110, and has a normal center line 11 and a twist axis 12 adjustable relative to the normal center line 11. In addition, the first driving mechanism 20 is capable of driving the work piece 2 to tilt relative to the normal center line 11 as an illustrated difference between FIG. 1 and FIG. 3, while the second driving mechanism 30 is capable of driving the work piece 2 to rotate about the twist axis 12. Besides, the scan head 10 is disposed at a right end of the swing arm 40, while the horizontal arm 50 is disposed at a left end of the swing arm 40 and fixed within a chamber of the ion implanter. Further, the third driving mechanism 60 is capable of driving the swing arm 40 to rotate about a tilt axis 41 (rotatable about a Z axis in a plane X-Y and, for example, aligned a center of the work piece 2) as the illustrated difference between FIG. 1 and FIG. 3, while the fourth driving mechanism 70 is capable of driving the swing arm 40 to swing about a horizontal axis 51 (always parallel to the Z axis).

In a case as illustrated in FIG. 3, a charged particle beam will always perpendicularly impinge the work piece 2 during the fourth driving mechanism 70 drives the swing arm 40 to swing the work piece 2 about the horizontal axis 51. In such a case, referring to FIG. 10, a projection P of the charged particle beam projected on the work piece 2 is always identical to a cross-sectional contour of the charged particle beam and composed of, for example but not limited to, a core portion Pc and a periphery portion Pp, wherein the core portion Pc has an ellipse contour and a higher ion density, while the periphery portion Pp has a circular contour and a lower ion density. Furthermore, the projection P scans the work piece 2 along a scan direction Ds and an orientation O of the projection P (for example the major axis of the core portion Pc) is continuously rotated relative to the work piece 2 between O' and O" with the swing. It should be noted that since the contour of the projection P is always maintained, an effect caused by the rotation of the orientation O is minor, even though can be ignored.

In contrast, in a case as illustrated in FIG. 2, not only the orientation of the work piece 2 but also the projection contour of the charged particle beam projected on the work piece 2 will be continuously varied during the fourth driving mechanism 70 drives the swing arm 40 to swing the work piece 2 about the horizontal axis 51. Hence, in such a case, a significant non-uniform implantation result is probably obtained when the effect caused by the variations of the orientation and the contour of the projection is too obvious to be ignored. However, the non-uniform implantation result may be undesired. As a result, in order to compensate such a undesired non-uniform implantation result, it is possible to activate at least one of the first driving mechanism 20, the second driving mechanism 30 and the third driving mechanism 60 to adjust the orientation of the work piece 2 relative to the normal center line 11.

In detail, referring to FIG. 2 and FIG. 11, the projection P is varied with the tilt of the work piece 2, and the contours of the core portion Pc and the periphery portion Pp referring to the orientation O (for example the miner axis of the periphery portion Pp) are respectively varied into, for example but not limited to, a circular contour and an ellipse contour. In such a case, when the fourth driving mechanism 70 drives the work piece 2 as shown in FIG. 2 to swing about the horizontal axis 51 upward or downward without adjusting the orientation of the work piece 2, not only the orientation O is continuously rotated between O' and O", but also the contour of the projection P is continuously varied, for example, the miner axes of the periphery portions Pp referring to both of the orientations O' and O" may be thinner than the orientation O. In another word, all of the included angles formed between the twist axis 12 and the charged particle beam in planes X-Y, Y-Z and X-Z will be continuously varied. In order to essentially compensate the variations, it is possible to continuously activate the first driving mechanism 20 to tilt the work piece 2 relative to the normal center line 11, continuously activate the second driving mechanism 30 to rotate the work piece 2 about the twist axis 12 and/or continuously activate the third driving mechanism 60 to rotate the swing arm 40 about the tilt axis 41. As a result, referring to FIG. 12, not only the contour but also the orientation O of the projection P can be always maintained, so that the implantation result becomes controllable.

In the present embodiment, the scan head 10 has a shaft assembly 110 with the twist axis 12 and a pivot point 13 fixed in the scan head 10, while the first driving mechanism 20 is disposed between the swing arm 40 and the scan head 10 and comprises at least a motor 21 and a relay lever set 22, wherein the pivot point 13 will be described later with the detail of the second driving mechanism 30. Herein, the shaft of the motor 21 is parallel to the tilt axis 41. In addition, the relay lever set 22 has a pivot point 23 fixed in the scan head 10, and its left end linking up with the shaft of the motor 21 and its right end linking up with a position of the shaft assembly 110 away from the pivot point 13. Here, the right end of the relay lever set 22 is linking up with the position, for example but not limited to, between the pivot point 13 and a lower end of the shaft assembly 110. Accordingly, as long as the motor 21 drives the relay lever set 22 to counterclockwise/clockwise rotate about the pivot point 23, the shaft assembly 110 is counterclockwise/clockwise rotated about the pivot point 13 since the lower end thereof is pushed rightward/pulled leftward by the relay lever set 22, so that not only the twist axis 12 relative to the normal center line 11 but also the orientation of the work piece 2 are adjusted. However, in other non-illustrated embodiment, the shaft of the motor can also be arranged perpendicular to both of the normal center line and the tilt axis, and thus the shaft assembly can also be rotated about the pivot point in other directions since the lower end thereof is pushed forward/pulled backward by the relay lever set.

Figure 6:
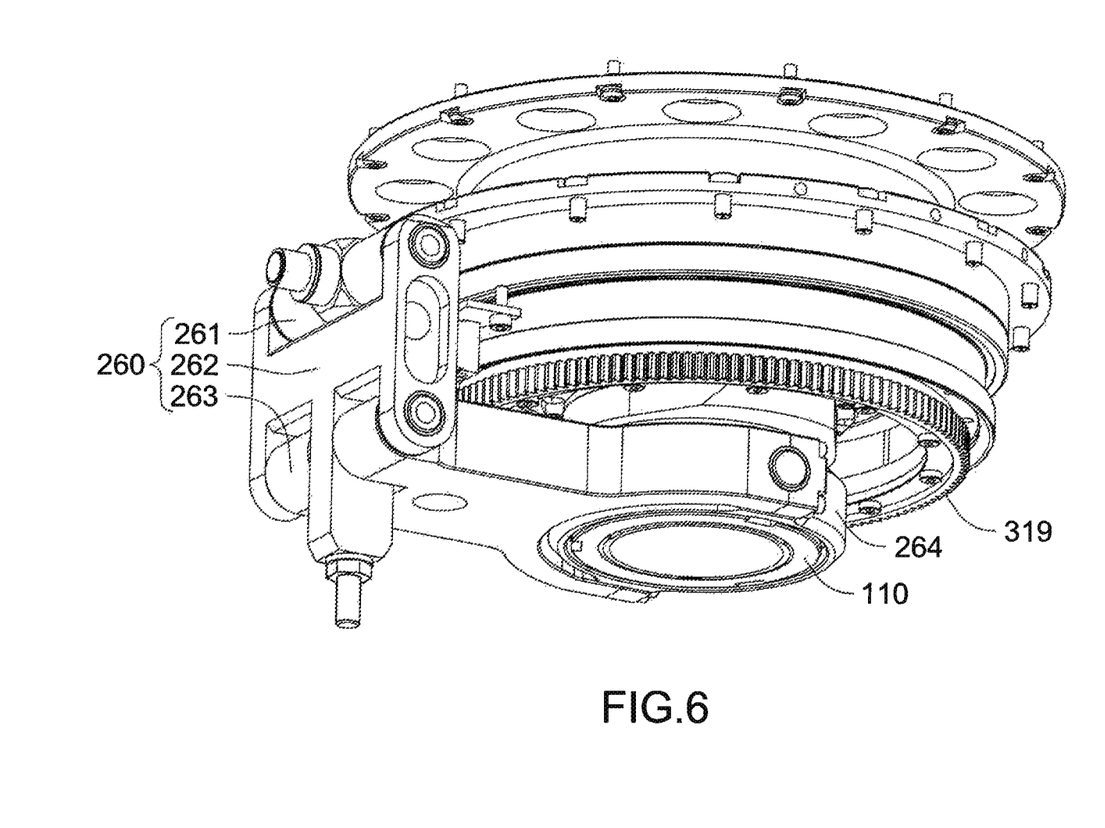
FIG. 6 illustrates a perspective view of the scan head as illustrated in FIG. 5, wherein the case and the ESC are omitted.

Furthermore, the second driving mechanism 30 is disposed in the scan head 10 and comprises a gimbal assembly 31, at least a motor 32 (exemplarily illustrating two motors in FIG. 3) and a pinion gear 33. Herein, the gimbal assembly 31 fits around the shaft assembly 110 for providing the pivot point 13, a shaft of the motor 32 is parallel to the normal center line 11, while the pinion gear 33 fits onto the shaft of the motor 32 and engages with the gimbal assembly 31. As illustrated in FIG. 4, in a preferred embodiment, the gimbal assembly 31 can comprise an inner ring 310, a middle ring 312 and an outer ring 314, wherein the middle ring 312 can be pivoted around the inner ring 310 by a pair of pivot shafts 316, while the outer ring 314 can be pivoted around the middle ring 312 by a pair of pivot shafts 318 perpendicular to the pivot shafts 316. Moreover, the inner ring 312 can fit around the shaft assembly 110 (as illustrated in FIG. 1), for example between the first driving mechanism 20 and the ESC 110, and the outer ring 314 can be fit within a case 100 of the scan head 10 via a bearing (not shown). In addition, the outer ring 314 can further have a plurality of teeth 319 (as illustrated in FIG. 6) formed around its outer surface for engaging with the pinion gear 33 (as illustrated in FIG. 1). Accordingly, it is possible to not only tilt the shaft assembly 110 about the pivot point 13 relative to the case 100 (i.e. adjust the twist axis 12 relative to the normal center line 11), but also enable the motor 32 to drive the gimbal assembly 31 to rotate about the twist axis 12 via an engagement of the teeth 319 and the pinion gear 33.

Moreover, the third driving mechanism 60 is disposed between the swing arm 40 and the horizontal arm 50 and comprises at least a motor 61, a pinion gear 62 and a ring gear 63. A shaft of the motor 61 is parallel to the tilt axis 41, the pinion gear 62 fits onto the shaft of the motor 61, and the ring gear 63 fits onto the swing arm 40 and engages with the pinion gear 62. Accordingly, the motor 61 can drive the swing arm 40 to rotate about the tilt axis 41 via, an engagement of the pinion gear 62 and the ring gear 63.

Besides, the fourth driving mechanism 70 is, for example but not limited to, a motor disposed within the horizontal arm 50, and a shaft thereof is directly fit in the horizontal arm 50. Accordingly, the fourth driving mechanism 70 can directly drive the horizontal arm 50 to swing about the horizontal axis 51 since an axis of the shaft thereof is coincident with the horizontal axis 51.

Except the above-mentioned embodiment, the following description further discloses more details about the scan head 10, the first driving mechanism 20 and the second driving mechanism 30 and the relationships there-between according to an embodiment of the present invention.

Figure 5:
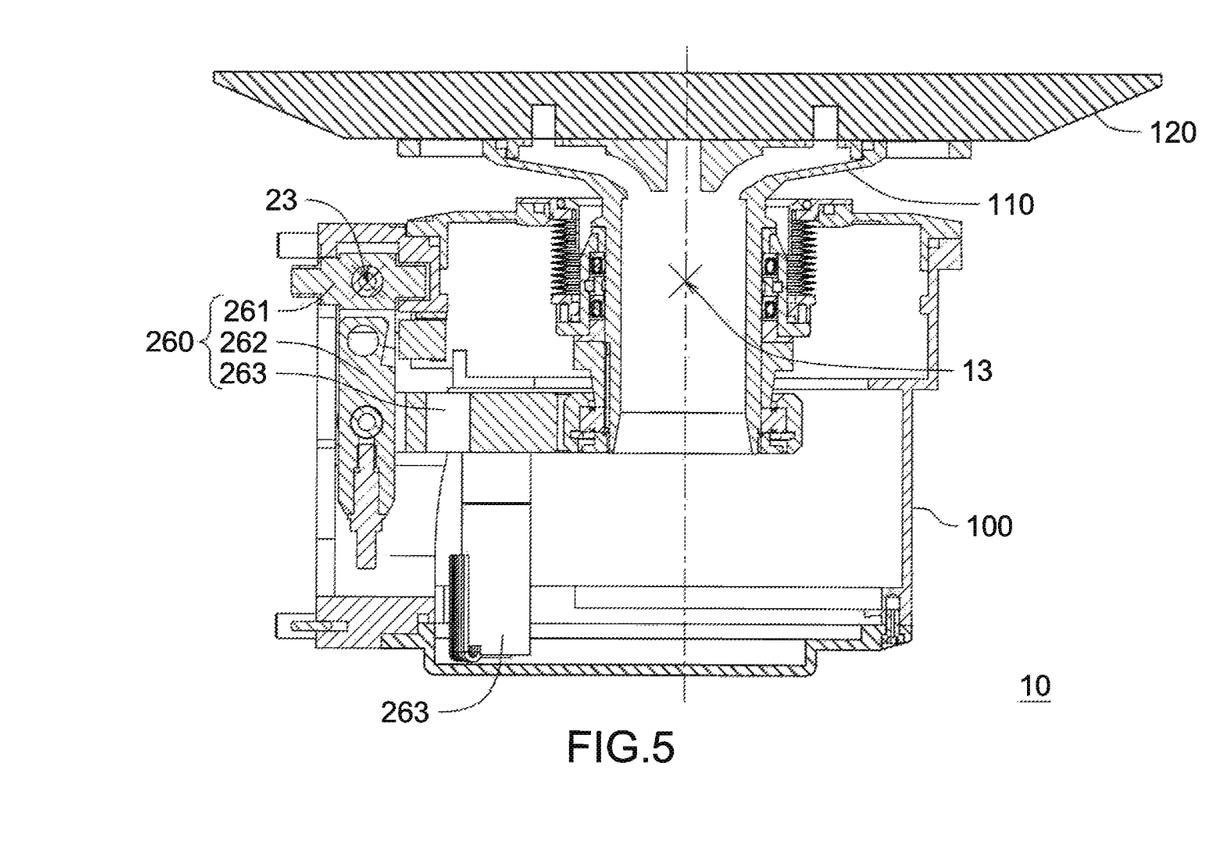
FIG. 5 illustrates a cross-sectional view of a scan head according to an embodiment of the present invention, wherein the gimbal assembly is omitted.
Figure 7:
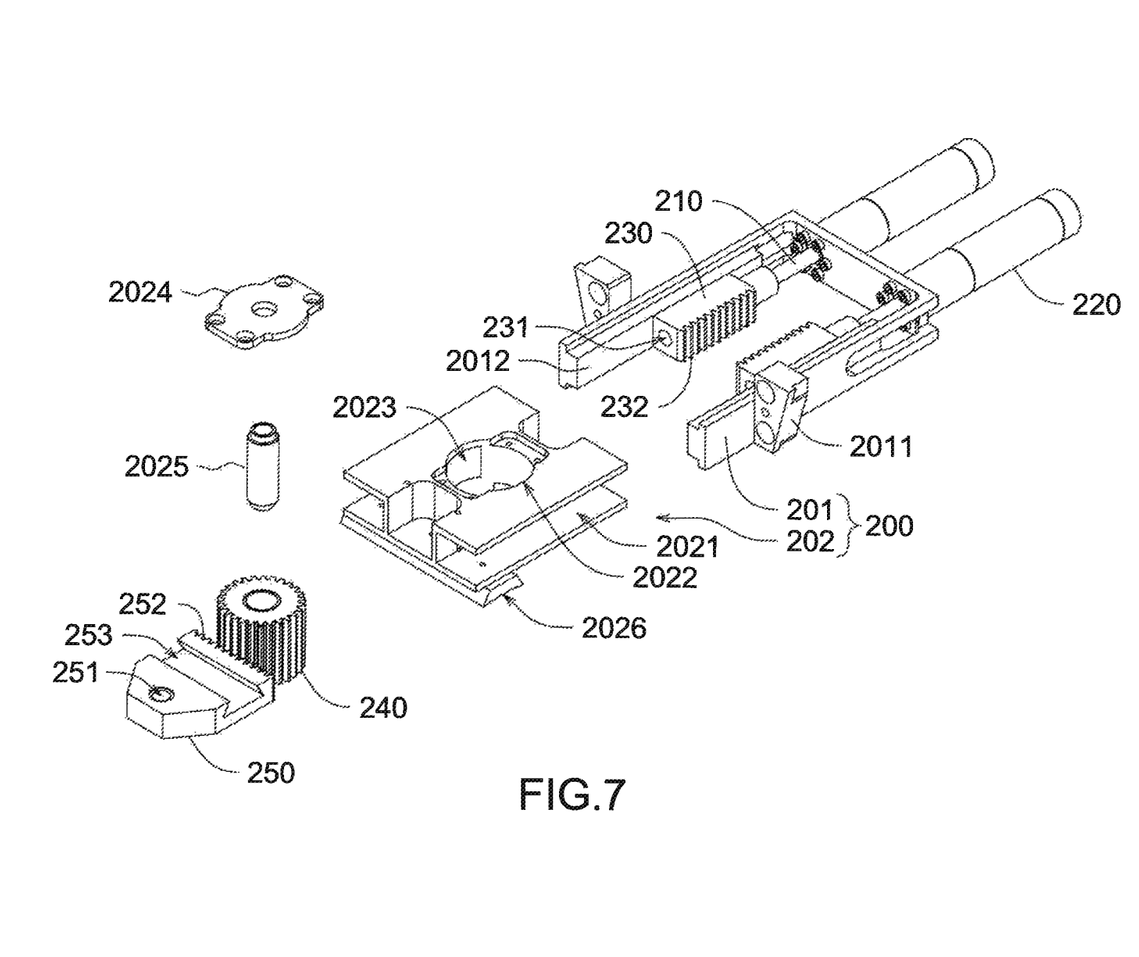
FIG. 7 illustrates an exploded perspective view of a first driving mechanism according to an embodiment of the present invention.
Figure 8:
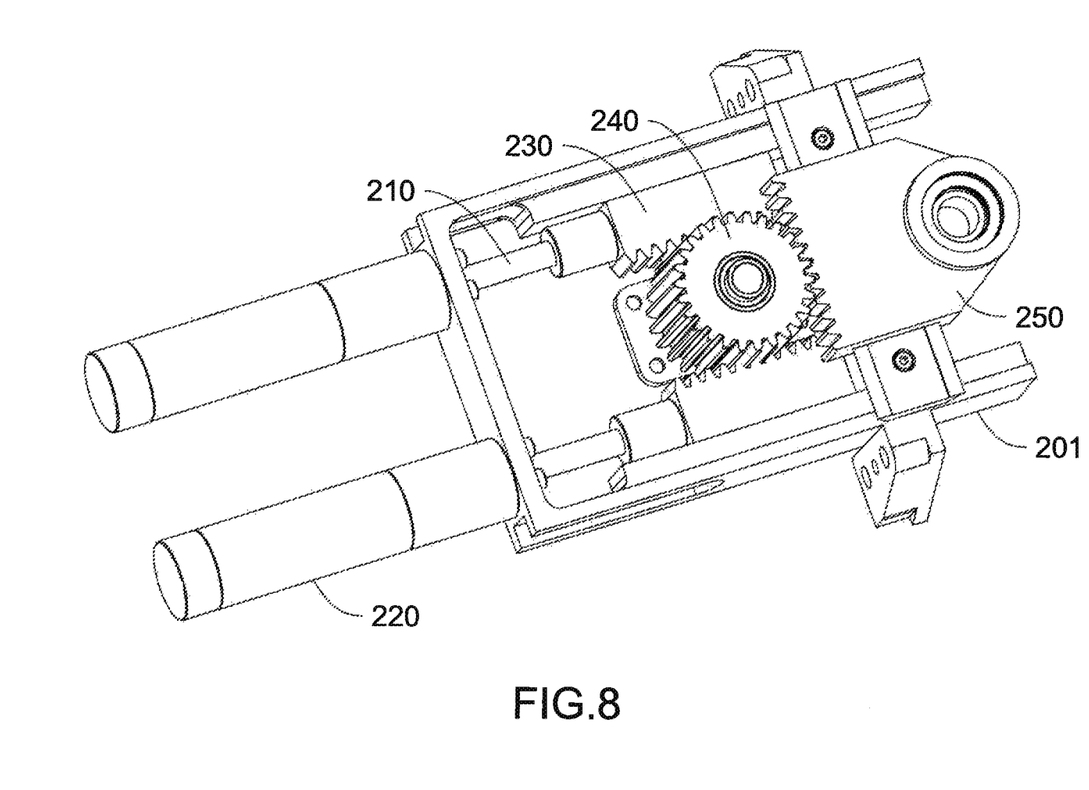
FIG. 8 illustrates an assembled perspective view of the first driving mechanism as illustrated in FIG. 7 from a lower angle of view, wherein the slide frame is omitted.
Figure 9:
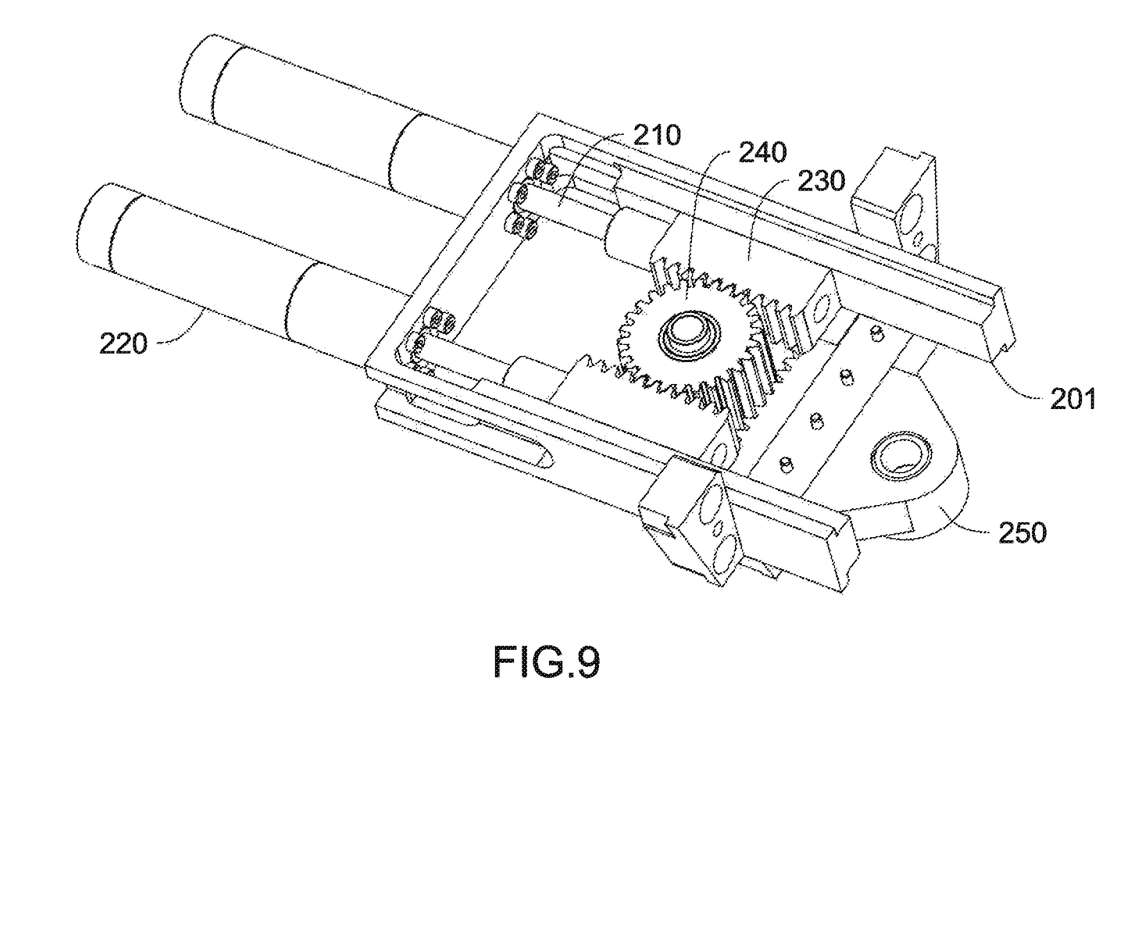
FIG. 9 illustrates another assembled perspective view of the first driving mechanism as illustrated in FIG. 7 from an upper angle of view, wherein the cover and the slide frame are omitted.

FIG. 5 illustrates a cross-sectional view of a scan head according to an embodiment of the present invention, wherein the gimbal assembly is omitted. Moreover, FIG. 6 illustrates a perspective view of the scan head as illustrated in FIG. 5, wherein the case and the ESC are omitted. Furthermore, FIG. 7 illustrates an exploded perspective view of a first driving mechanism according to an embodiment of the present invention. Besides. FIG. 8 illustrates an assembled perspective view of the first driving mechanism as illustrated in FIG. 7 from a lower angle of view, wherein the slide frame is omitted. Further, FIG. 9 illustrates another assembled perspective view of the first driving mechanism as illustrated in FIG. 7 from an upper angle of view, wherein the cover and the slide frame are omitted. In addition, all of the upper side (upward), the lower side (downward), the left side (leftward) and the right side (rightward) described in the present embodiment refer to the orientation of FIG. 5.

Referring to FIG. 1, FIG. 5 and FIG. 6 together first, the scan head 10 of the present embodiment can comprise the case 100, the shaft assembly 110, an ESC 120, the first driving mechanism 20 and the second driving mechanism 30. The case 100 has the normal center line 11. Furthermore, the shaft assembly 110 passes through an upper side of the case 100 and has the twist axis 12, the pivot point 13 fixed relative to the case 100, an upper end located outside the case 100 and a lower end located inside the case 100. Besides, the ESC 120 is fastened on the upper end of the shaft assembly 110 and capable of holding the work piece 2. In addition, the first driving mechanism 20 is capable of driving all of the shaft assembly 110, the ESC 120 and the work piece 2 to tilt relative to the normal center line 11, and the second driving mechanism 30 is capable of driving all of the shaft assembly 110, the ESC 120 and the work piece 2 to rotate about the twist axis 12. In the present embodiment disclosed as below, all of the details of the second driving mechanism 30 are substantially the same as the description in the previous embodiment illustrated with FIG. 1 to FIG. 4 and thus are omitted herein.

In detail, in the previous embodiment as shown in FIG. 1, the first driving mechanism 20 is simply composed of the motor 21 and the relay lever set 22 for tilting the shaft assembly 110 along a single direction. However, the scope of the present invention should not limited by the previous embodiment. Referring to FIG. 5, FIG. 6 and FIG. 7 together, in the present embodiment, the first driving mechanism 20 can also tilt the shaft assembly 110 in multiple directions and is composed of, for example but not limited to, a frame set 200, a pair of lead screws 210, a pair of motors 220, a pair of gear racks 230, a center gear 240, a gear rack 250 and a relay lever set 260.

In such a case, the frame set 200 is fixed relative to the case 100 and composed of a fixed frame 201 and a slide frame 202. Herein, the fixed frame 201 can be fixed in the case 100 via a pair of fastening portions 2011 and have two guide portions 2012 parallel to the tilt axis 41 (as illustrated in FIG. 1). In addition, the lead screws 210 pass through a side of the fixed frame 201 and axes thereof are parallel to the tilt axis 41 as well. Besides, the motors 220 are fastened on the side of the fixed frame 201 and capable of driving the lead screws 210 to rotate. In contrast, the slide frame 202 has two guide portions 2021, a gear receiver 2022, two windows 2023, a cover 2024, a gear shaft 2025 and a guide portion 2026. Herein, the guide portions 2021 can receive the guide portions 2012 and the gear racks 230, the gear receiver 2022 can receive the center gear 240, and the windows 2023 are respectively formed between one of the guide portions 2021 and the gear receiver 2023.

Moreover, the cover 2024 can cover the gear receiver 2022, while the gear shaft 2025 can pass through the center gear 240. Besides, each one of the gear racks 230 has a threaded hole 231 engaging with one of the lead screws 210 and a plurality of teeth 232 arranged along the tilt axis 41, while the gear rack 250 has a shifting hole 251, a plurality of teeth 252 and a guide portion 253. Herein, the teeth 252 are arranged along a direction not parallel to the tilt axis 41 (exemplarily illustrated perpendicular to both of the normal center line 11 and the tilt axis 41 in the present preferred embodiment) and can engage with the center gear 240, while the guide portion 253 corresponds to the guide portion 2026 in shape.

Besides, the relay lever set 260 is, for example but not limited to, composed of a pivot shaft 261, a relay lever 262 and a relay lever 263. Here, a middle portion of the pivot shaft 261 is fixed relative to the case 100 for providing the pivot point 23. In addition, an upper end of the relay lever 262 is pivoted to two ends of the pivot shaft 261, while a lower end of the relay lever 262 is inserted in the shifting hole 251. Further, a left end of the relay lever 263 is pivoted to a middle portion of the relay lever 262, while a right end of the relay lever 263 is pivoted to a ring 264 fitting around the lower end of the shaft assembly 110. Hence, as long as the lower end of the relay lever 262 is shifted, the shaft assembly 110 will be tilted by the relay lever set 260 via the ring 264.

In the present preferred embodiment, the frame set 200, the gear racks 230, the center gear 240 and the gear rack 250 can be, for example but not limited to, assembled by the steps illustrated as below. First, the gear racks 230 are assembled on the lead screws 210 via the engagements of the threaded holes 231 and the lead screws 210, wherein the teeth 232 of the two gear racks 230 are arranged facing each other. Next, the slide frame 202 is glidingly assembled to the fixed frame 201 via combinations of the guide portions 2012 and the guide portions 2021, so as to enable each one of the gear racks 230 to be glidingly moved along a guiding tunnel formed between one of the guide portions 2012 and the corresponding one of the guide portions 2021. Therefore, as long as the motors 220 drive the lead screws 210 to rotate, the gear racks 230 are individually moved back and/or forth relative to the fixed frame 201.

Afterward, the gear rack 250 is further glidingly assembled to the slide frame 202 via a combination of the guide portion 253 and the guide portion 2026, and then the center gear 240 is received into the gear receiver 2023. Herein, some teeth of the center gear 240 can be exposed by the windows 2023 and a side of the gear receiver 2023 facing the teeth 252, so as to synchronously engage with the teeth 232 of the two gear racks 230 and the teeth 252 of the gear rack 250 as shown in FIG. 8 and FIG. 9. Finally, the assembling procedure is finished by passing the gear shaft 2025 through the center gear 240 and covering the cover 2024 over the gear receiver 2023.

Based on the detail structure illustrated above, if the motors 220 drive the lead screws 210 to rotate in the same direction and speed, the gear racks 230 are synchronously moved back or forth along the tilt axis 41, so as to pull or push the gear rack 250 along the tilt axis 41 via a combination of the slide frame 202 and the center gear 240. As a result, the shifting hole 251 will shift the lower end of the shaft assembly 110 along the tilt axis 41 via the relay lever set 260. In contrast, if the motors 220 drive the lead screws 210 to rotate in different directions with the same speed, the gear racks 230 are moved along the tilt axis 41 relative to the fixed frame 201 in opposite directions with the same speed, and thus the gear rack 250 is shifted along the direction perpendicular to both of the normal center line 11 and the tilt axis 41 since the center gear 240 is rotated without shifted. As a result, the shifting hole 251 will shift the lower end of the shaft assembly 110 along the direction perpendicular to both of the normal center line 11 and the tilt axis 41 via the relay lever set 260. Therefore, it is clearly understood that the shaft assembly 110 can be tilted to any direction about the pivot point 13 by individually controlling the rotation directions and speeds of the motors 220.

In summary, based on the above-mentioned descriptions, the first driving mechanism can tilt the work piece relative to the normal center line, the second driving mechanism can rotate the work piece about the twist axis, and the third driving mechanism can tilt the work piece along the tilt axis. As a result, it is possible to essentially maintain the orientation of the work piece relative to the charged particle beam as required by continuously activating at least one of the first driving mechanism, the second driving mechanism and the third driving mechanism during the fourth driving mechanism drives the work piece to swing relative to the charged particle beam. Accordingly, the implantation result becomes controllable since the projection contour of the charged particle beam projected on the work piece is maintained even though the charged particle beam does not perpendicularly impinge the work piece.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A scan head, assembled to a scan arm for an ion implanter, and comprising:
   a case, having a normal center line;
   a shaft assembly, passing through a first side of the case and having a twist axis, a first pivot point fixed relative to the case, a first end located outside the case and a second end located inside the case;
   an electrostatic chuck (ESC), fastened on the first end and capable of holding a work piece;
   a first driving mechanism, capable of driving the shaft assembly, the ESC and the work piece to tilt relative to the normal center line; and
   a second driving mechanism, capable of driving the shaft assembly, the ESC and the work piece to rotate about the twist axis.

2. The scan head as claimed in claim 1, wherein the first driving mechanism comprises:
   a relay lever set, having a third end linking up with a position of the shaft assembly away from the first pivot point and a fourth end opposite to the third end; and
   a motor, linking up with the fourth end and capable of driving the relay lever set to move along a direction parallel to the tilt axis.

3. The scan head as claimed in claim 1, wherein the first driving mechanism comprises:
   a frame set, fixed relative to the case;
   a pair of lead screws, passing through the frame set and axes of the lead screws parallel to a first direction;
   a pair of motors, fixed relative to the frame set and capable of driving the lead screws to rotate about the first direction respectively;
   a pair of first gear racks, respectively having a threaded hole engaging with one of the lead screws and a plurality of first teeth arranged along the first direction;
   a center gear, engaging between the first teeth of the gear racks;
   a second gear rack, having a shifting hole and a plurality of second teeth engaged with the center gear and arranged along a second direction not parallel to the first direction; and a relay lever set, having a second pivot point fixed relative to the case, a third end fitting around the second end and a fourth end inserted in the shifting hole.

4. The scan head as claimed in claim 3, wherein the second gear rack further has a first guide portion parallel to the second direction, and the frame set comprises:
 a fixed frame, fixed in the case, passed through by the lead screws, fastening the motors thereon and having two second guide portions parallel to the first direction; and
 a slide frame, comprising:
  two third guide portions, wherein the slide frame is glidingly assembled with the fixed frame via combinations of the second guide portions and the third guide portions, and each one of the first gear racks is glidingly assembled between one of the second guide portions and one of the third guide portions;
  a gear receiver, wherein the center gear is received in the gear receiver;
  two windows, respectively formed between one of the third guide portions and the gear receiver;
  a cover, covering the gear receiver;
  a gear shaft, passing through the center gear and held between the gear receiver and the cover; and
  a fourth guide portion, wherein the second gear rack is glidingly assembled with the slide frame via combinations of the first guide portion and the fourth guide portion.

5. The scan head as claimed in claim 3, wherein the first direction is perpendicular to the second direction.

6. The scan head as claimed in claim 3, wherein the relay lever set comprises:
 a first pivot shaft, fixed relative to the case, so as to provide the second pivot point;
 a first relay lever, having the fourth end, a fifth end pivoted to the first pivot shaft and a sixth end; and
 a second relay lever, having the third end and a seventh end pivoted to the sixth end.

7. The scan head as claimed in claim 1, wherein the second driving mechanism comprises:
 a gimbal assembly, fitting around the shaft assembly, so as to provide the first pivot point;
 a motor, having a shaft parallel to the normal center line; and
 a pinion gear, fitting onto the shaft and engaging with the gimbal assembly.

8. The scan head as claimed in claim 7, wherein the gimbal assembly is located between the ESC and the first driving mechanism.

9. The scan head as claimed in claim 7, wherein the gimbal assembly comprises:
 an inner ring, fitting around the shaft assembly;
 a middle ring, pivoted around the inner ring by a pair of first pivot shafts; and
 an outer ring, fitting within the case via a bearing, pivoted around the middle ring by a pair of second pivot shafts perpendicular to the first pivot shafts, and having a plurality of teeth formed around an outer surface of the outer ring and engaging with the pinion gear.

\* \* \* \* \*